United States Patent [19]

Markle et al.

[11] Patent Number: 5,329,332
[45] Date of Patent: Jul. 12, 1994

[54] SYSTEM FOR ACHIEVING A PARALLEL RELATIONSHIP BETWEEN SURFACES OF WAFER AND RETICLE OF HALF-FIELD DYSON STEPPER

[75] Inventors: David A. Markle, Saratoga; Gerald J. Alonzo; Hwan J. Jeong, both of Los Altos, all of Calif.

[73] Assignee: Ultratech Stepper, Inc.

[21] Appl. No.: 994,238

[22] Filed: Dec. 21, 1992

[51] Int. Cl.$^5$ ............................................. G03B 27/42
[52] U.S. Cl. ..................................... 355/53; 355/125; 356/138
[58] Field of Search .......................... 355/53, 67, 125; 356/150, 138; 359/727

[56] References Cited

U.S. PATENT DOCUMENTS

| | | | |
|---|---|---|---|
| 4,504,144 | 3/1985 | Trost | 356/150 |
| 4,666,292 | 5/1987 | Imamura et al. | 355/67 |
| 4,770,531 | 9/1988 | Tanaka et al. | 356/358 |
| 4,845,530 | 7/1989 | Matsukawa | 355/53 |
| 4,964,765 | 10/1990 | Markle | 350/442 |
| 5,003,345 | 3/1991 | Markle | 355/53 |
| 5,040,882 | 8/1991 | Markle | 359/727 |
| 5,164,794 | 11/1992 | Markle | 356/394 |

Primary Examiner—Richard A. Wintercorn

[57] ABSTRACT

Disclosed is tilt-sensing means that employs a point source of alternate 1st or 2nd divergent light beams which, after passing through collimating lenses of the Half-Field Dyson projection optics of the stepper, are separately incident on and reflected from a reflective pattern disposed on the surface of a reticle and from a reflective surface of a wafer, together with two-dimensional position detection means responsive to the position of each of the reflected alternate 1st or 2nd divergent light beams, for independently sensing the angular position of the surface of the reticle and the angular position of the surface of the wafer to determine thereby whether or not the surface of the reticle and the surface of the wafer are substantially parallel to one another. This permits adjustment means of the stepper, which is responsive to the respective surfaces having been determined by the tilt-sensing means to be not parallel to one another, to angularly adjust the angular position of at least one of the reticle and the wafer to bring the respective surfaces thereof into a substantially parallel relationship with one another.

13 Claims, 8 Drawing Sheets

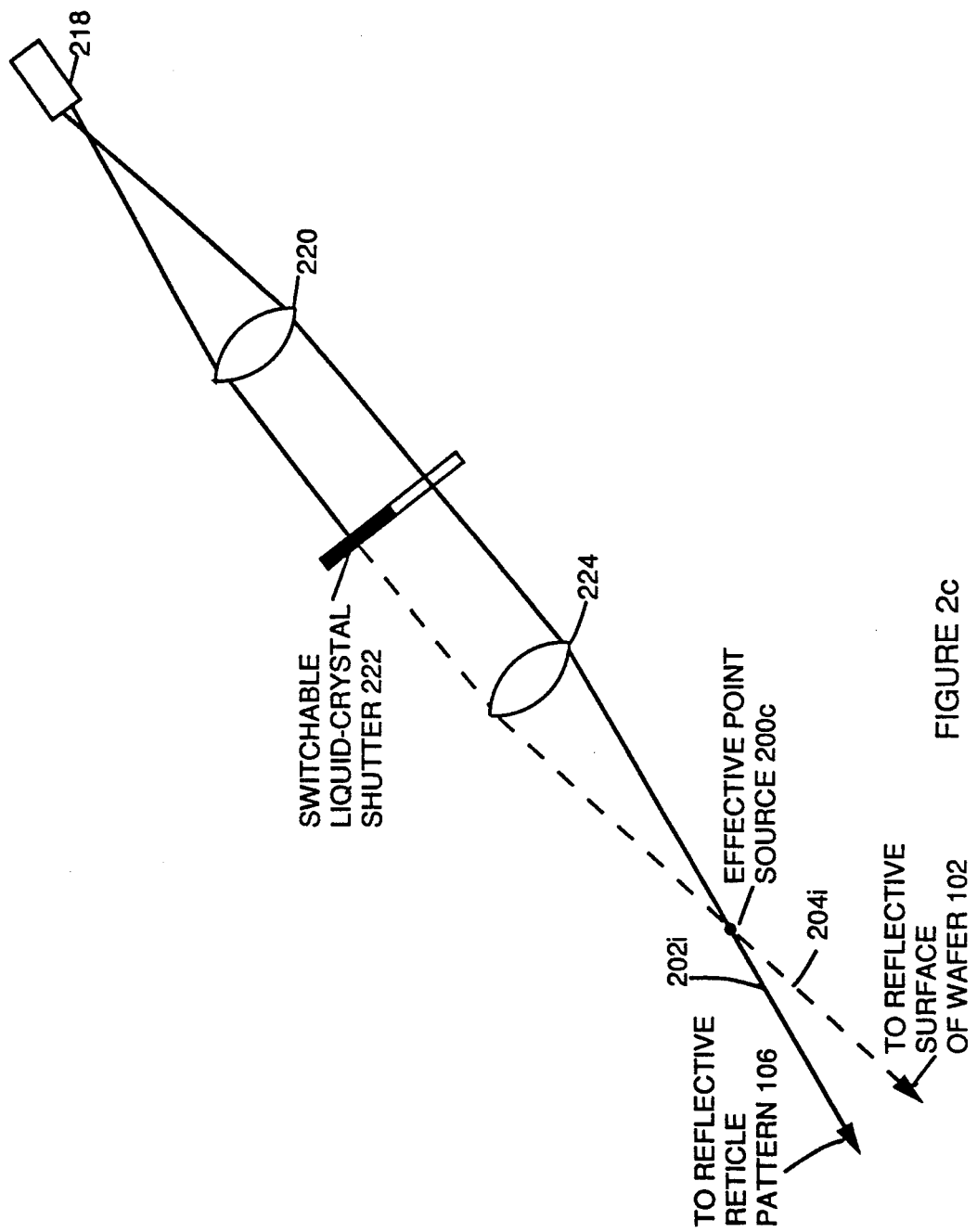

SYSTEM FOR ACHIEVING A PARALLEL RELATIONSHIP BETWEEN SURFACES OF WAFER AND RETICLE OF HALF-FIELD DYSON STEPPER

CROSS-REFERENCE TO RELATED APPLICATIONS

The present application is related to the following copending applications filed concurrently with the present application and assigned to the same assignee as the present application: Ser. No. 993,547, entitled "Focusing Technique Suitable for Use with an Unpatterned Specular Substrate"; Ser. No. 994,239, entitled "Illumination System for Half-Field Dyson Stepper"; and Ser. No. 993,795, entitled "An Alignment System for a Half-Field Dyson Projection System".

BACKGROUND OF THE INVENTION

1. Field of the Invention

This invention relates to a system for achieving a parallel relationship between a wafer surface and a reticle-pattern surface of a microlithographic stepper employing unit magnification optics.

2. Description of the Prior Art

In the fabrication of integrated circuits, a microlithographic stepper is used to image each of a stack of successive circuit-patterns on the surface of a silicon or GaAs wafer supported on a movable wafer stage of the stepper. The stepper, in response to control data applied thereto, is capable of precisely moving its wafer-supporting stage so as to bring each of the successively applied circuit-patterns of the stack into substantially perfect alignment with all the underlying circuit-patterns of the stack.

In particular, the wafer-supporting stage of a stepper is moved, with respect to a fixed base, to a particular X, Y coordinate position (in a substantially horizontal plane) in accordance with command position control signals received from a computer-controlled servo means. The computer-controlled servo means, like all servo means, is fed back information as to the then-existing actual position of the wafer-supporting stage, and then uses the error between this then-existing actual position and the command position to control the movement of the wafer-supporting stage in X and/or Y directions so as to reduce this error to substantially zero. However, the servo means, because it is computer-controlled, is capable of accomplishing this and other tasks in a sophisticated manner.

Specifically, the computer-controlled servo means normally includes an analog-to-digital (A/D) converter (unless the actual position information is already in digital form), a digital computer processing unit (CPU), memory means, and a stored program (which may comprise software) for controlling the operation of the CPU. Actual position information data from the wafer-supporting stage may be directly stored in memory, may be processed by the CPU before being stored in memory and/or may be employed, either before or after such processing, to modify the stored program. Further, the computer-controlled servo means may have manual data input means for selecting any one of different stored programs therein for the purpose of choosing any one of a plurality of separate modes of command-position control operation for the wafer-supporting stage. For example, in addition to including a stored program for implementing its normal operating mode for controlling the movement for the wafer-supporting stage, the computer-controlled servo means also may include a stored program for implementing a certain calibration-mode operation of movement for the wafer-supporting stage. Alternatively, the stored program itself may automatically choose such a calibration-mode operation at certain specified programmed times. In general, the computer control of the servo means permits any desired mode of operation thereof to be realized in determining the command position control signals applied to the wafer-supporting stage and/or in processing the actual position information data received from the wafer-supporting stage.

The wafer stepper includes suitable mechanical means including motor means coupled to the wafer-supporting stage capable of providing the stage with translational motion relative to a fixed base of the wafer stepper with respect to each of the three mutually orthogonal axes X, Y and Z (where the axes X and Y are substantially horizontally oriented and the axis Z is substantially vertically oriented). Further, this motor means is capable of providing the wafer-supporting stage with rotational motion about each of axes X, Y and Z. By coupling the aforesaid computer-controlled servo means to the mechanical means of the wafer stepper, precise control of both translation and rotation of the wafer-supporting stage is achieved.

While it is possible to employ contact printing for imaging a circuit-pattern on the surface of the wafer, it is more practical to employ a projection optical system for this purpose. One type of such projection optical system, now known as a Half-Field Dyson projection optical system, is disclosed in U.S. Pat. No. 4,964,705, entitled "Unit Magnification Optical System," which issued Oct. 23, 1990 to David A. Markle, and in its continuation-in-part U.S. Pat. No. 5,040,882, entitled "Unit Magnification Optical System with Improved Reflective Reticle," which issued Aug. 20, 1991 to David A. Markle (both of the aforesaid patents being assigned to the same assignee as the present patent application). The teachings of both of these patents are incorporated herein by reference. Specifically, an advantage of Half-Field Dyson projection optical system is that it is particularly suitable for projecting an image of a reflective reticle integrated-circuit layer pattern, that occupies a relatively large optical field, on the surface of a wafer.

The features of both a reticle integrated-circuit layer pattern and its image on a wafer surface have microscopic dimensions. This means that a high numerical aperture is required of any projection optical system, such as the Half-Field Dyson projection optical system, in order to obtain a high-resolution image of the integrated-circuit layer pattern on the wafer surface. Such a high numerical aperture projection optical system has a microscopic depth-of-focus. Further, the thickness of a wafer varies from one wafer to another. The problem is then to make sure that the surface of a wafer is controllably moved by the stepper to that position where the wafer's surface substantially coincides with the image plane of the projection optical system of the stepper.

Reference is made to the teachings disclosed in the aforesaid cross-referenced copending patent application Ser. No. 993,547. This patent application discloses a technique which makes it possible to precisely position the wafer's surface with respect to the reticle by employing an image of a repetitive diffraction pattern on the reticle which is focused only on a small spot on the wafer's surface (i.e., the small spot itself substantially coincides with the image plane of the projection optical system of the stepper). However, the entire area of the wafer's surface will not substantially coincide with the image plane of the projection optical system of the stepper unless the wafer is also controllably adjusted by the stepper to that position where the wafer's surface is angularly oriented substantially parallel to the reticle's surface. The present invention is directed to apparatus for accomplishing this.

SUMMARY OF THE INVENTION

The present invention is directed to a microlithographic stepper employing unit magnification optics (e.g., a Half-Field Dyson projection optical system) for imaging a reflective pattern disposed on a surface of a reticle onto a partially reflective surface of a wafer, that, in combination with the stepper, also comprises tilt-sensing means. The tilt-sensing means includes a source of radiation separately reflected from the reflective pattern disposed on the surface of the reticle and from the reflective surface of the wafer for independently sensing the angular position of the surface of the reticle and the angular position of the surface of the wafer to determine thereby whether or not the surface of the reticle and the surface of the wafer are substantially parallel to one another. This permits adjustment means of the stepper, which is responsive to the respective surfaces having been determined by the tilt-sensing means to be not parallel to one another, to angularly adjust the angular position of at least one of the reticle and the wafer to bring the respective surfaces thereof into a substantially parallel relationship with one another.

BRIEF DESCRIPTION OF THE DRAWINGS

FIG. 1b illustrates 3-dimensional Cartesian coordinates used to reference the orientation of the sectional view of the Half-Field Dyson microlithographic stepper projection optical system shown in FIGS. 1 and 1a;

FIG. 2c schematically illustrates a second example of means for implementing the point source of alternate 1st or 2nd light beams functionally shown in the FIG. 2 embodiment;

DESCRIPTION OF THE PREFERRED EMBODIMENTS

Figure 1:
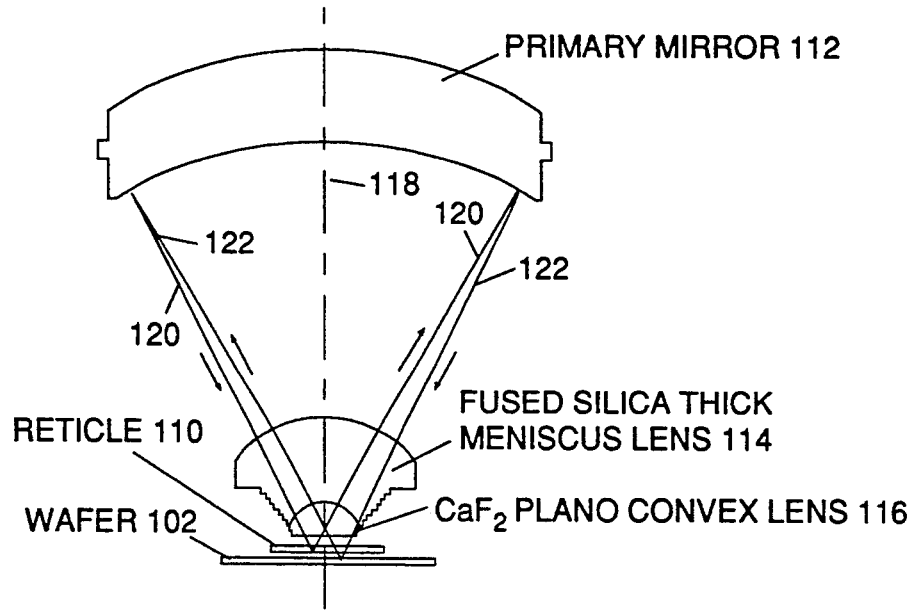
FIGS. 1 and 1a schematically illustrate prior-art structure of a Half-Field Dyson microlithographic stepper projection optical system similar to that disclosed in the aforesaid Markle patents.
Figure 1A:
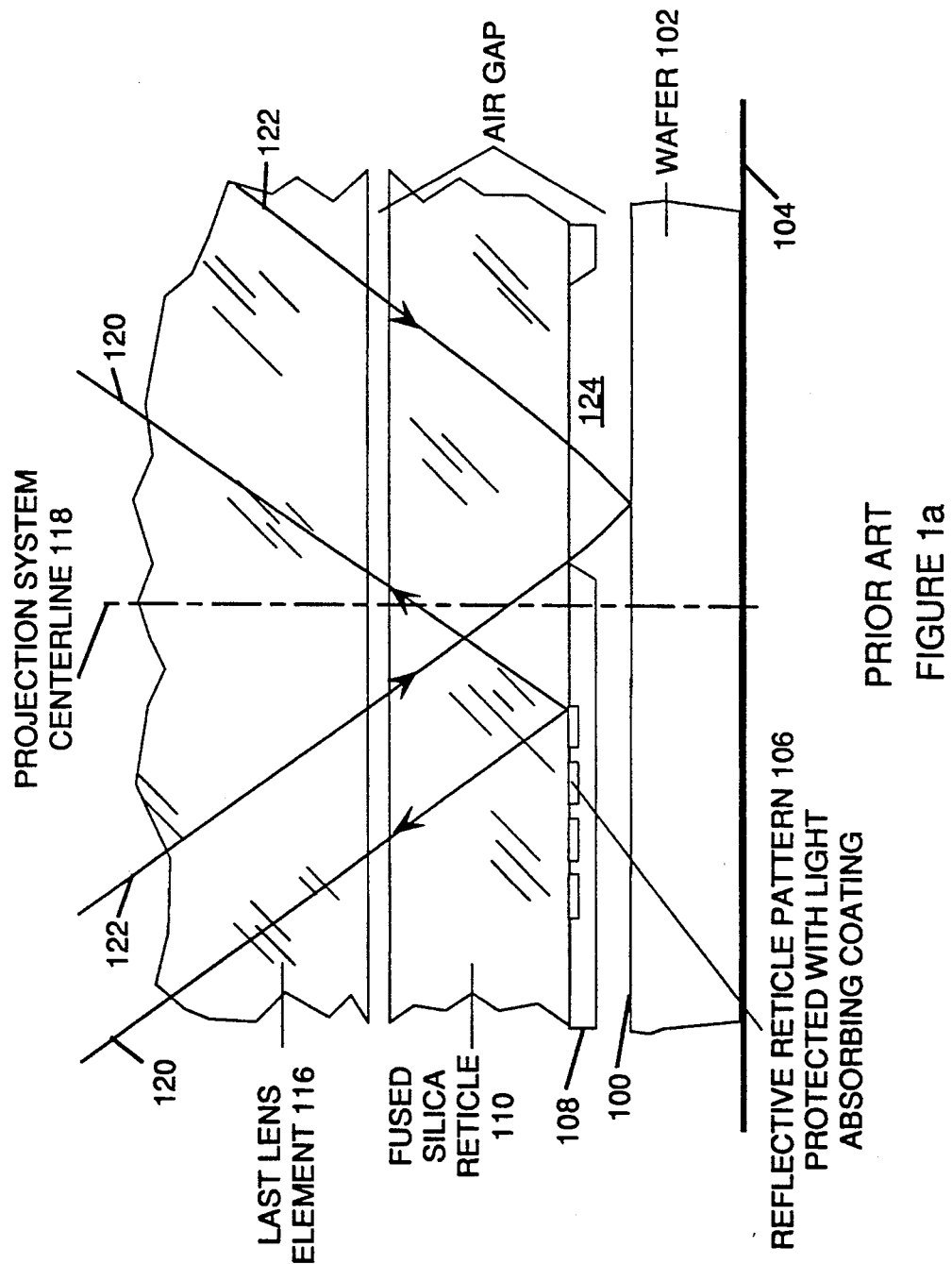
Figure 3:
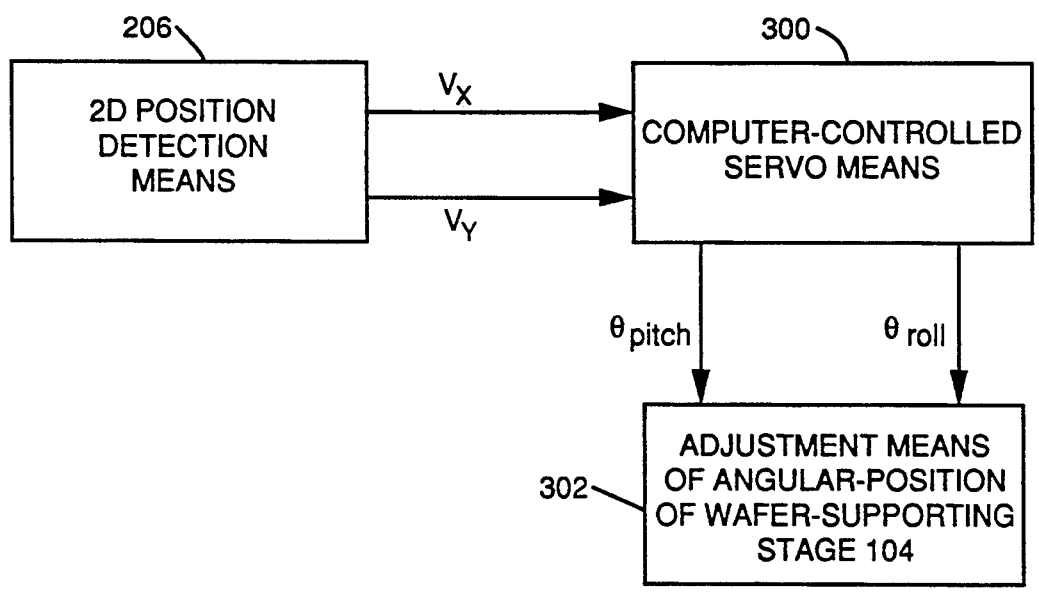
FIG. 3 is a block diagram of means responsive to the sensed amount of out-of-parallel relationship between the reflective wafer surface and the reflective reticle surface for adjusting the angular position of the reflective wafer surface to bring it into a parallel relationship with the reflective reticle surface.

Referring to FIGS. 1 and 1a, there is shown the structure of the Half-Field Dyson projection optical system, as currently designed, of a microlithographic stepper. As shown, upper surface 100 of wafer 102 (which wafer is supported by movable wafer-stage 104 of the microlithographic stepper) is situated slightly below (i.e., about 0.15 mm below) reflective reticle pattern 106. Reflective reticle pattern 106, which is backed with a protective light-absorbing coating 108, is situated on the underside of fused silica reticle 110. The Half-Field Dyson projection optical system comprises concave primary spherical mirror 112, fused silica thick meniscus lens 114 and $CaF_2$ plano convex lens 116, all of which are symmetrically disposed about optic axis 118. Primary mirror 112, which is partially reflective and partially transmissive, permits focused illuminating light (asymmetrically disposed slightly off of optic axis 118, as shown in FIG. 3 of the aforesaid U.S. Pat. No. 4,964,705) from a light source situated on the other side of primary mirror 112 to be transmitted through primary mirror 112 and imaged on reflective reticle pattern 106. The reticle 110 is situated so that light rays 120 reflected from reflective reticle pattern 106, which lies in an object plane of the projection optical system will reflect from primary mirror 112 as light rays 122 that, after traveling through reticle window 124 in reticle 110, are imaged in an image plane of the projection optical system situated below its object plane.

The Half-Field Dyson projection optical system, as currently designed, is a 1 to 1 magnification system, that employs a 600 millimeter separation between primary mirror 112 and its predetermined image plane and can provide a 20×40 mm field size even with a numerical aperture as high as 0.7. Such a Half-Field Dyson system, operating at a deep ultra-violet wavelength (e.g., 248 nm derived from either a mercury lamp or a KrF excimer laser) would easily resolve a feature of reflective reticle pattern 106 having dimensions as small as 0.25 $\mu$m in size.

The thickness of wafers varies from one wafer to another. In order that an in-focus image of reflective reticle pattern 106 be imaged on upper wafer surface 100, it is essential that the position of wafer 102, supported by movable wafer-stage 104, be moved with extremely high precision so that its upper surface 100 is, at least, within the very small (i.e., about 0.50 $\mu$m) depth of focus of the above-described Half-Field Dyson projection optical system. This requires a focusing system for determining whether or not an in-focus image of reflective reticle pattern 106 is, in fact, imaged on upper wafer surface 100, and, if not, deriving control data for moving wafer-stage 104 to that position at which upper wafer surface 100 is substantially coincident with the image of reflective reticle pattern 106.

Figure 1B:
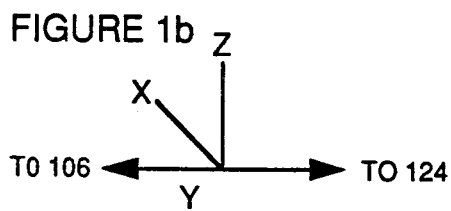

Referring to the 3-dimensional Cartesian coordinates shown in FIG. 1b, it is apparent that the sectional views of the Half-Field Dyson microlithographic stepper projection optical system shown in FIGS. 1 and 1a lie in a vertical Y-Z plane oriented parallel to the plane of the paper, with the Z coordinate corresponding to the vertical optic axis 118, so that the X coordinate is oriented perpendicular to the plane of the paper. In this view, the Y coordinate lies horizontally in the vertical Y-Z plane, with reticle pattern 106 being situated to the left and reticle window 124 being situated to the right of the optic axis 118 Z coordinate.

Ideally, the surface of reflective reticle pattern 106 should lie exactly in the horizontal X-Y plane. However, it is apparent from the above discussion that critical focusing dimensions are microscopic in size. Therefore, in practice, the surface of reflective reticle pattern 106 will tend to be tilted in both the X and Y dimensions with respect to the horizontal plane by some unknown microscopic amounts. Further, upper wafer surface 100 will tend to be tilted in both the X and Y dimensions with respect to the horizontal plane by some other unknown microscopic amounts. To achieve focusing it is not essential that either the surface of reflective reticle pattern 106 or upper wafer surface 100 be situated exactly in the horizontal plane. However, in addition to positioning upper wafer surface 100, in accordance with the teachings of the aforesaid cross-referenced co-pending patent application Ser. No. 993,547, so that only a small spot on the upper wafer's surface is in focus, it is essential that the surface of reflective reticle pattern 106 and upper wafer surface 100 be substantially parallel to one another in order that all of upper wafer surface 100 is entirely in focus. In this regard, reference is now made to additional structure (other than that already shown in FIGS. 1 and 1a) that is functionally shown in FIG. 2.

Figure 2:
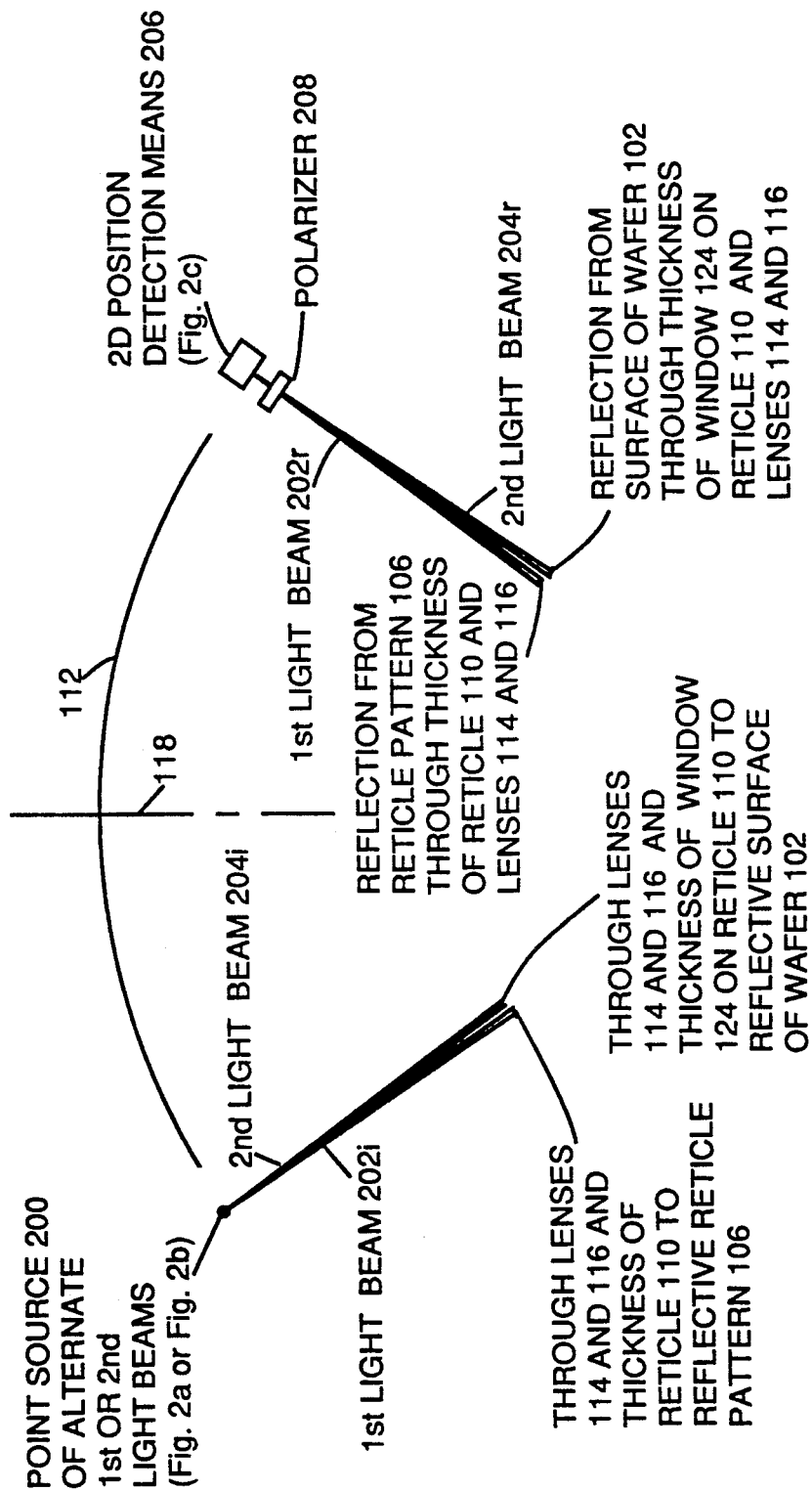
FIG. 2 functionally illustrates an embodiment of the present invention for quantitatively sensing the amount of any out-of-parallel relationship between a reflective surface of a wafer and a reflective reticle-pattern surface of a microlithographic stepper employing a Half-Field Dyson projection optical system.

As indicated in FIG. 2, point source 200 of alternate 1st or 2nd light beams is located beyond the left edge of primary mirror 112 and is situated in the immediate vicinity of an extension of the spherical surface of primary mirror 112. Point source 200 is capable of alternatively deriving either 1st divergent light beam 202i or 2nd divergent light beam 204i, which beams are angularly inclined with respect to optic axis 118 and are directed toward lenses 114 and 116 of the Half-Field Dyson projection optical system shown in FIG. 1. The 1st divergent light beam 202i, after being directed through lenses 114 and 116 and the thickness of fused silica reticle 110, is incident on the reflective surface of reticle pattern 106 (all of which elements 106, 110, 114 and 116 are shown in FIG. 1 and/or in FIG. 1a). However, 2nd light beam 204i, after being directed through lenses 114 and 116 and the thickness of window 124 on fused silica reticle 110, is incident on the reflective upper wafer surface 100 (all of which elements 100, 110, 124, 114 and 116 are shown in FIG. 1 and/or in FIG. 1a). While each of 1st and 2nd light beams 202i and 204i is slightly divergent when it leaves point source 200, after being refracted by lenses 114 and 116, each of 1st and 2nd light beams 202i and 204i that emerges from lenses 114 and 116 is collimated (as shown in FIG. 2a, discussed below).

1st incident light beam 202i, upon reflection from the reflective surface of reticle pattern 106, gives rise to 1st reflected light beam 202r and 2nd incident light beam 204i, upon reflection from the reflective upper wafer surface 100, gives rise to 2nd reflected light beam 204r, which reflected beams are also angularly inclined with respect to optic axis 118. Each of 1st and 2nd reflected light beams 202r and 204r, which after passing -through lenses 114 and 116 becomes slightly convergent, focuses to a small light spot located beyond the right edge of primary mirror 112 and situated in the immediate vicinity of an extension of the spherical surface of primary mirror 112. These focused small light spots are situated in the useful aperture of two-dimensional (2D) position detection means 206. 2D position detection means 206, with respect to the center of its useful aperture, provides an output indicative of the position offset in each of two dimensions of a received light spot. So long as the reflective upper wafer surface 100 is angularly oriented parallel to the reflective surface of reticle pattern 106, the respective positions of the small focused light spots of reflected light beams 202r and 204r will coincide, regardless of whether or not these reflective surfaces are angularly oriented exactly normal to optic axis 118. However, should the reflective upper wafer surface 100 not be angularly oriented parallel to the reflective surface of reticle pattern 106 (i.e., these reflective surfaces are tilted in one or both of two dimensions with respect to one another), the respective positions of the reflected light beams 202r and 204r small light spots will be slightly displaced from one another. As shown in FIG. 2, polarizer 208 is disposed in the path of convergent reflected light beams 202r and 204r relatively close to the focus position of these beams. However, polarizer 208 could be disposed anywhere in the path of either divergent incident light beams 202i and 204i or convergent reflected light beams 202r and 204r. Nevertheless it is desirable that polarizer 208 be situated relatively close to either the position of point light source 200 or in the position shown in FIG. 2 in order to reduce the required size of the polarizer. Reference is now made to FIG. 2a for a discussion of the purpose of polarizer 208, assuming that polarizer 208 is situated in the position shown in FIG. 2.

Figure 2A:
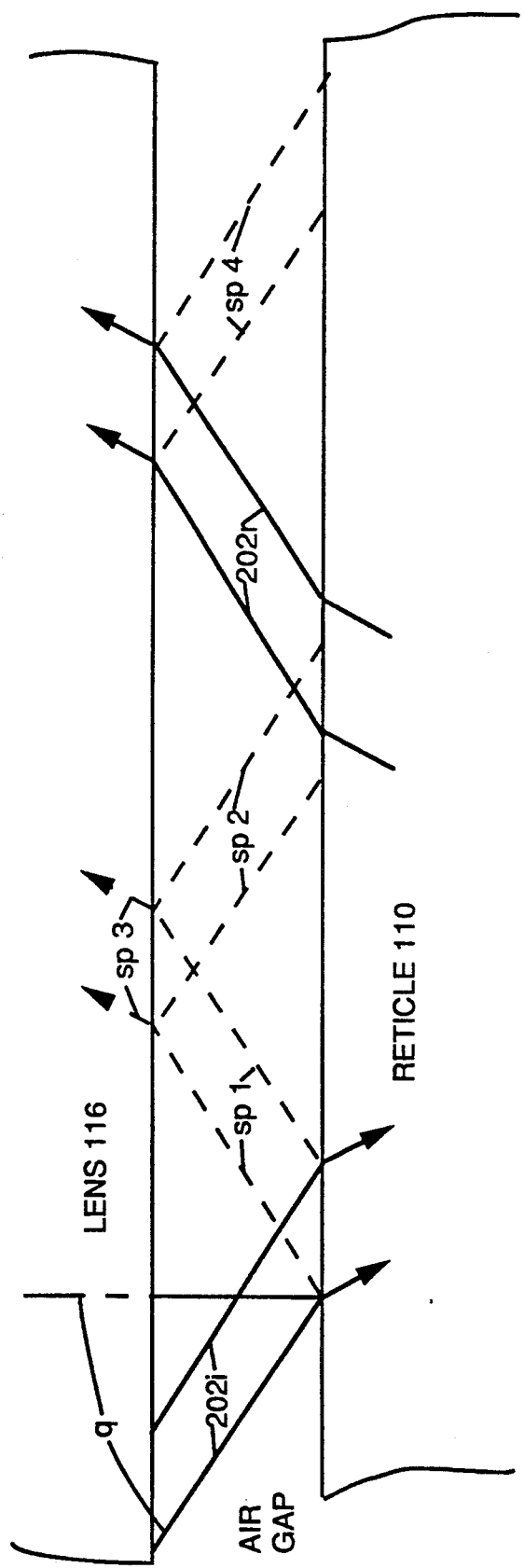
FIG. 2a is a detail drawing schematically illustrating the effect of illuminating the upper surface of the reticle of the microlithographic stepper with a point-source light beam functionally shown in the FIG. 2 embodiment, after the point-source light beam has been collimated by passing it through the lenses of the Half-Field Dyson projection optical system.

Referring now to FIG. 2a, collimated light beam 202i emerging from lens 116 (shown by solid lines) is incident on the left portion of upper plane surface of reticle 110 at an angle $\theta$ with respect to the normal 118a thereto. Collimated light beam 202i is sufficiently wide to flood the reflective surface of reticle pattern 106 (on the lower surface of reticle 110) with illumination, but is insufficiently wide to illuminate any of reticle window 124. In a similar manner, collimated light beam 204i (not shown), which is incident on the right portion of upper plane surface of reticle 110, is sufficiently wide to illuminate reticle window 124, but is insufficiently wide to illuminate any of the reflective surface of reticle pattern 106. Further, if reticle 110 lies in the X-Y plane, normal 118a will be parallel to optic axis 118. Otherwise, normal 118a will be tilted with respect to optic axis 118.

As known, only a portion of any incident unpolarized light traveling from a lower index-of refraction transmissive medium (e.g., the air gap between lens 116 and reticle 110) to a higher index-of refraction transmissive medium (e.g., reticle 110) is transmitted through the higher index-of refraction medium, with the rest of the incident light being reflected from the interface surface between the two mediums. Light reflected from the plano surfaces intermediate between the source and the reticle pattern or wafer plane must be minimized in order to obtain signals truly representative of the relative tilt between the reticle pattern and wafer. This may be achieved by using light that is polarized so that the electric vector lies in the plane of FIG. 2, and which intercepts the plano surfaces at or near Brewster's angle. In the case of the Half-Field Dyson projection optical system, the angle of incidence $\theta$ of the collimated light beam 202$i$, shown in FIG. 2$a$, will be equal to Brewster's angle if divergent light beam 202$i$, shown in FIG. 2, is inclined at substantially 34° with respect to optic axis 118.

As further shown in FIG. 2$a$ is collimated light beam 202$r$ (shown by solid lines) that, after reflection from reticle pattern 106, emerges from reticle 110 and is incident on the bottom plane surface of lens 116. Also shown in shown in FIG. 2$a$ by dashed lines is spurious light, respectively designated sp 1, sp 2, sp 3 and sp 4. Specifically, sp 1 represents the above-described portion of collimated light beam 202$i$ reflected from the upper surface of reticle 110; sp 2 represents the portion of sp 1 incident on the bottom surface of lens 116 and reflected therefrom; sp 3 represents the portion of sp 1 incident on the bottom surface of lens 116 and transmitted therethrough; and sp 4 represents the portion of collimated light beam 202$r$ reflected from the the bottom surface of lens 116 and transmitted therethrough. The entire electric vectors of all of this spurious light sp 1, sp 2, sp 3 and sp 4 (shown by dashed lines) are oriented substantially normal to the paper, in the manner described above. However, a large portion of the electric vector of light beam 202$r$ transmitted through lens 116 (shown by solid lines) is oriented parallel to the plane of the paper, in the manner described above.

Polarizer 208, shown in FIG. 2, is oriented to reject substantially all of the spurious light sp 1, sp 2, sp 3 and sp 4. (i.e., having an electric vector oriented normal to the paper) incident thereon, but to transmit therethrough to 2D position detection means 206 substantially solely all of that electric-vector-component portion of light beam 202$r$ incident thereon which is oriented parallel to the plane of the paper.

Although not specifically discussed, it is apparent that polarizer 208 operates in a similar manner to reject substantially all of that spurious light incident thereon (i.e., light having an electric vector oriented normal to the paper) which was derived from collimated light beam 204$i$ incident on upper surface 100 of wafer 102 and collimated light beam 204$r$ reflected therefrom, but to transmit therethrough to 2D position detection means 206 substantially solely all of that electric-vector-component portion of light beam 204$r$ incident thereon which is oriented parallel to the plane of the paper. The limiting of the residual amount of spurious light (i.e., light having an electric vector oriented normal to the paper) actually reaching 2D position detection means 206 to a very small value by means of providing an angle of incidence $\theta$ substantially equal to Brewster's angle and also by means of polarizer 208 is, at least, very desirable for providing a high wanted light signal to unwanted spurious light ratio for properly operating 2D position detection means 206, and may be required for this purpose.

It is apparent that polarizing incident light beams 202$i$ and 204$i$ prior to their incidence on reticle 110, rather than polarizing reflected light beams 202$r$ or 204$r$ subsequent to their emergence from reticle 110 (i.e., the latter being the case shown in FIG. 2), in no material way affects the function performed by polarizer 208. Specifically, if collimated light beams 202$i$ and 204$i$ incident on reticle 110 are already polarized, the residual amount of spurious light that is derived is close to zero.

Reference is now made to FIG. 2$b$, which illustrates a first example of means for implementing point source 200 of alternate 1st or 2nd light beams functionally shown in the FIG. 2 embodiment. Shown in FIG. 2$b$ are two light sources 210-1 and 210-2, condenser lenses 214-1 and 214-2, fold mirror 212, and doublet lens 216. Light sources 210-1 and 210-2, which, for example, may be light emitting diodes (or LED's), or diode lasers, represent effective point sources of light 200$b$1 and 200$b$2 that are located near primary mirror 112 (shown in FIG. 2) in positions which approximately represents an extension of the spherical surface thereof. Light from LED's 210-1 and 210-2 is formed by condenser lenses 214-1 and 214-2, fold mirror 212, and doublet lens 216 into the beams 202$i$ and 204$i$, which appear to originate from a common point source 200 (as shown in FIG. 2 and discussed above).

More particularly, when LED 210-1 is switched on, light therefrom passes through condenser lens 214-1 and directly through doublet lens 216 which forms it into gradually diverging beam 204$i$ when LED 210-2 is switched on, light therefrom, after passing through condenser lens 214-2, being reflected from fold mirror 212 and passing through doublet lens 216, is formed into gradually diverging beam 202$i$. Fold mirror 212 allows the respective locations of beams 202$i$ and 204$i$ to be brought close together, while accommodating the physical size of condenser lenses 214-1 and 214-2, and, further, permits both beams 202$i$ and 204$i$ to appear to originate at effective point source of light 200$b$1. As discussed above in connection with FIGS. 2 and 2$a$, beams 202$i$ and 204$i$ are angularly inclined with respect to optic axis 118 so that, after they pass through lenses 114 and 116 of the Half-Field Dyson optical system, they will be substantially fully collimated and parallel to one another when they are incident on reticle 110. Preferably, the angle of inclination of beams 202$i$ and 204$i$ has that value (i.e., about 34°) that results in these beams, when collimated, being incident on reticle 110 at substantially Brewster's angle.

Reference is now made to FIG. 2$c$, which illustrates a second example of means for implementing point source 200 of alternate 1st or 2nd light beams functionally shown in the FIG. 2 embodiment. Shown in FIG. 2$c$ is light source 218, collimating lens 220, switchable liquid-crystal shutter 222, and focusing lens 224. Light source 218, which may be an LED, generates a diverging beam of light which is converted to a collimated beam of a given width by lens 220. Switchable liquid-crystal shutter 222, which is situated in the path of the collimated beam of light emerging from lens 220, is capable of blocking the top half of the width and transmitting solely the bottom half of the width of the collimated beam in a first switch position (assumed in FIG. 2$c$ to be the switch position) of shutter 222 or, alternatively, blocking the bottom half of the width and transmitting solely the top half of the width of the collimated beam in a second switch position (assumed in FIG. 2$c$ not to be the switch position) of shutter 222. Whichever half of the width of the collimated beam is transmitted by shutter 222 is focused to effective point source 200$c$, with effective point source 200 being located near primary mirror 112 (shown in FIG. 2) in a position which approximately represents an extension of the spherical surface thereof. Emerging from effective point source 200$c$ is either first or second light beams 202$i$ and 204$i$, depending on the switch position of shutter 222. In the assumed switch position of shutter 222, no light is present in beam 204i, as indicated by the use of a dashed line beyond shutter 222.

Figure 2B:
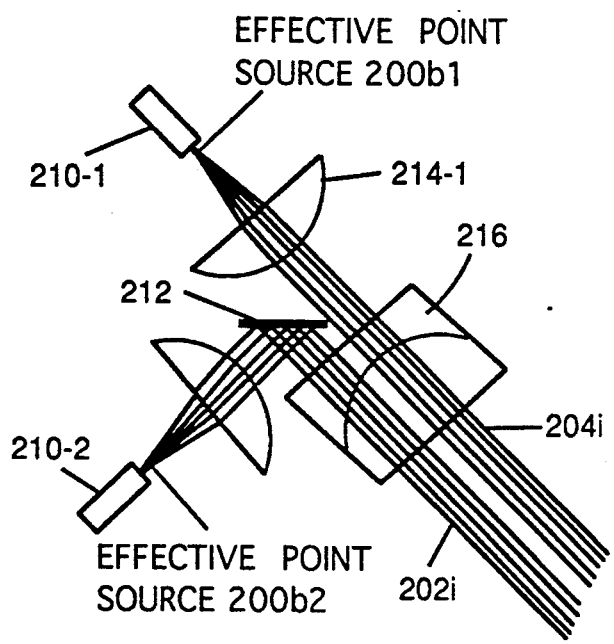
FIG. 2b schematically illustrates a first example of means for implementing the point source of alternate 1st or 2nd light beams functionally shown in the FIG. 2 embodiment.
Figure 2D:
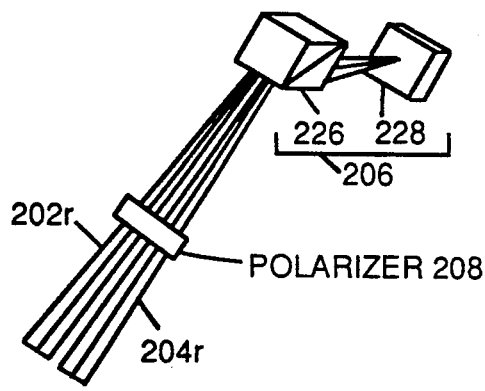
FIG. 2d schematically illustrates an example of means for implementing the two-dimensional position detection means functionally shown in the FIG. 2 embodiment.

Reference is now made to FIG. 2d, which schematically illustrates an example of means for implementing 2D position detection means 206 that is functionally shown in FIG. 2. As shown in FIG. 2d, 2D position detection means 206 comprises fold prism 226 for reflecting polarized beam 202r or polarized beam 204r to a focus as a spot generally within the useful aperture of position-sensitive detector 228. A position-sensitive detector, such as the UDT-DLS-10, available from United Detector Technologies Inc of Orlando, Fla., which is capable of sensing the position of a spot focused thereon to about one part in one-thousand of its useful aperture, may be employed as position-sensitive detector 228. Fold prism 226 can be constructed so that the desired polarization in beam 202r or in beam 204r is preferentially reflected to position-sensitive detector 228.

Figure 2E:
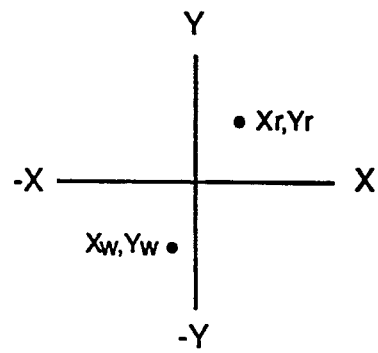
FIG. 2e schematically illustrates the two-dimensional position information sensed by the detection means of FIG. 2c.

Position-sensitive detector 228 generates as an output a first voltage magnitude $V_x$, indicative of the position offset in the X direction, and a second voltage magnitude $V_y$, indicative of the position offset in the Y direction, of the position of the center-of-gravity (i.e, a weighted average) of a light spot focused thereon with respect to the center of the useful aperture thereof. For instance, FIG. 2e shows, as a first example, the position offset $X_r$, $Y_r$ that a light spot of beam 202r reflected from reticle pattern 106 might have, and, as an alternative second example, the position offset $X_w$, $Y_w$ that a light spot of beam 204r reflected from upper surface 100 of wafer 102 might have.

The operation of the disclosed embodiments of the present invention, for quantitatively sensing the amount of any out-of-parallel relationship between the reflective upper surface 100 of wafer 102 and reflective reticle-pattern surface 106, will now be described.

In the case of the FIG. 2b embodiment, if LED 210-2 is switched on and LED 210-1 is switched off, beam 202i will be incident on the surface of reflective reticle pattern 106 and give rise to the detection of the two-dimensional offset position of the light spot generated by reflected beam 202r, while if LED 210-1 is switched on and LED 210-2 is switched off, beam 204i will be incident on the reflective upper surface 100 of wafer 102 and give rise to the detection of the two-dimensional offset position of the light spot generated by reflected beam 204r. In the case of the FIG. 2c embodiment, if liquid-crystal shutter 222 is switched so that beam 202i is transmitted and beam 204i is blocked, beam 202i will be incident on the surface of reflective reticle pattern 106 and give rise to the detection of the two-dimensional offset position of the light spot generated by reflected beam 202r, while if liquid-crystal shutter 222 is switched so that beam 204i is transmitted and beam 202i is blocked, beam 204i will be incident on the reflective upper surface 100 of wafer 102 and give rise to the detection of the two-dimensional offset position of the light spot generated by reflected beam 204r.

In either the case of the FIG. 2b or the 2c embodiment, the value of the position offset $X_r$, $Y_r$ (FIG. 2e) is a measure of the tilt, with respect to optic axis 118, of reflective reticle pattern 106 of reticle 110, and the position offset $X_w$, $Y_w$ (FIG. 2e,) is a measure of the tilt, with respect to optic axis 118, of reflective upper surface 100 of wafer 102. However, a property of the Half-Field Dyson projection optical system is that it is not important that reflective upper surface 100 of wafer 102 or reflective reticle pattern 106 of reticle 110 be positioned in a plane exactly normal to system optic axis 118. It is important, though, that reflective upper surface 100 of wafer 102 and reflective reticle pattern 106 of reticle 110 be substantially exactly parallel to each other. Such exact parallel relationship is achieved when the position offset $X_r$, $Y_r$ and the position offset $X_w$, $Y_w$ are identical in value in both dimensions.

It is particularly important that the portion of reticle 110 which comprises reflective reticle pattern 106 and the portion of reflective upper surface 100 of wafer 102 which receives a projected image of reticle pattern 106 be parallel. Given the usual manufacturing variations experienced in reticles and wafers, surfaces thereof may depart sufficiently from absolute flatness such that it may be only possible to ensure that relatively small portions of each are parallel. The tilt sensing system of the present invention may be arranged such that the relative inclination of only the surface portion of reticle 110 including the reticle pattern 106 portion thereof (the reticle field), and the portion of upper surface 100 of wafer 102 which receives a projected image of reticle pattern 106 (the wafer field), are interrogated by the tilt sensing system. Further, the tilt sensing system may be arranged such that all points of the reticle field and all points of the wafer field are interrogated. As such, tilt information produced by the system may provide a weighted average representation of the inclination of the wafer and reticle fields, thus accommodating any departures from surface flatness therein.

Optical leverage is provided for all the points in the wafer field of beam 204r by their relatively long path length from their respective points of reflection on the upper wafer surface 100 of wafer 102 to their focus within the dimensions of the useful aperture of position sensitive detector 228. This optical leverage may represent a tilt of about 20 microns across the wafer field on the upper surface 100 of wafer 102. This may be referred to as the acquisition range of detector 228, i.e., the maximum tilt variation that can be detected thereby. As such, the above described tilt sensor system may detect tilt differences (i.e., sense parallelism error), to an accuracy of about 0.02 microns across the wafer field of upper surface 100 of wafer 102. Thus it is possible to obtain a good margin on the acquisition range, without sacrificing detection sensitivity.

The tilt detection system according to the present invention does not require absolute calibration. Further, in combination with the above-described wafer-supporting stage 104, tilt correction may be effected by the means shown in FIG. 3, discussed below. To effect such a correction, reticle 110 with which wafer 102 is to be aligned is positioned in a predetermined location and is held in that location. The angular orientation of reticle 110 will depend on how its surface is tilted in the region of reticle pattern surface 106 to be aligned, on the reticle's seating on its support points on the reticle stage, and on other factors including the optical accuracy of the reticle substrate. The reticle's angular orientation is unimportant, since the tilt of wafer 102 may be adjusted by the means shown in FIG. 3 so that it is substantially exactly parallel to reticle 110. The orientation (tilt) of reticle 110 may thus be used as a reference by which other parallelism adjustments are made.

Referring now to FIG. 3, there is shown in block diagram 2D position detection means 206, which preferably includes position sensitive detector 228, for first deriving the above-described voltage magnitudes $V_x$, and $V_y$ indicative of the position offset $X_r$, $Y_r$ of reticle 1 10 and then deriving the above-described voltage magnitudes $V_x$, and $V_y$ indicative of the position offset $X_w$, $Y_w$ of wafer 102. All of these four voltage magnitudes are applied as inputs to computer-controlled servo means 300 of the Half-Field Dyson stepper. Computer-controlled servo means 300 includes an A/D for converting the analog $V_x$, and $V_y$ magnitude values to digital form, and then computing therefrom angular pitch ($\theta_{pitch}$) and angular roll ($\theta_{roll}$) output values, indicative of the required angular adjustment of the angular position (i.e., tilt) of wafer-supporting stage 104 in order to bring the wafer field on the upper surface 100 of wafer 102 into substantially exact parallel relationship with the reticle field of reticle 110. These ($\theta_{pitch}$) and angular roll ($\theta_{roll}$) output values are applied as inputs to adjustment means 302 of wafer-supporting stage 104 in order to control the angular movement of wafer-supporting stage 104 in two dimensions to effect its alignment to a substantially exact parallel relationship with the reticle field of reticle 110. The computer-controlled servo means 300, in controlling the angular movement of wafer-supporting stage 104 by adjustment means 302, can employ, alternatively, either open-loop or closed-loop operation. In open-loop operation, which is quicker, the X and Y offset positions of wafer 102 are measured only once prior to any angular movement of wafer-supporting stage 104 taking place, while in closed-loop operation, which may be more accurate, the X and Y offset positions of wafer 102 are measured continually while angular movement of wafer-supporting stage 104 is taking place and the remaining adjustment required to achieve parallelism is modified accordingly by servo means 300.

In practice, the wafer to be aligned with the reticle is first moved, employing the focusing technique taught in the aforesaid co-pending patent application, to a best focus point of the image of reticle pattern 106 near the edge of the wafer field closest to optical axis 118. Parallelism of the reticle and wafer field may then be established by tilting the wafer only about the best focus point already established. As such, once parallelism is established, all points on the wafer field will automatically have been adjusted to be substantially in a best focus position (i.e., all points on the wafer field will be situated substantially in the image plane of the Half-Field Dyson projection optical system).

In the preferred embodiment of the invention described above, parallelism is established by aligning the angular position of wafer 102 so that is is moved into the desired parallel relationship with reticle 110. However, it should be understood that this desired parallel relationship could be achieved instead by moving reticle 110 with respect to wafer 102 or, alternatively, by moving both wafer 102 and reticle 110 to the same certain given angular position.

The present invention for achieving parallelism of the reticle and wafer field provides certain advantages, such as a high signal to interference ratio due to polarization of beams 202r and 204r in the manner described above. Further, it should be noted that as reticle pattern 106 is a reflective pattern surrounded by light absorbing coating 108 (See Fig. 1a) only light reflected from the useful area of pattern 106 of reticle 110 is used to provide tilt information. Similarly only light reflected from the useful field of upper surface 100 of wafer 102 will be used to provide tilt information for wafer 102, as window 124 of reticle 110 provides an effective aperture stop for incident light, and light incident outside window 124 is substantially absorbed by absorbing coating 108. As such, a combination of polarization effects and a light absorbing coating on reticle 110 contribute to providing a tilt detecting system having a high signal to interference ratio.

Embodiments of a tilt sensing system for sensing the relative inclination of a reticle and wafer in a Half-Field Dyson projection optical system have been described. The tilt sensing system may be used in a Half-Field Dyson projection optical system which forms an image of a pattern of a reticle on a wafer located below the reticle. A useful feature of the tilt sensing system is that tilt information is provided which is relevant only for the pattern to be projected and for the portion of the wafer on which the pattern image is to be received. Tilt sensing information includes information from the entire area of the reticle pattern and the entire area of the wafer on which the pattern image is to be received. As such, local flatness variations in those areas may be averaged out.

Another useful feature of the tilt sensing system is that absolute calibration is not required. The relative inclination of the reticle may be established and used as a reference for adjusting the inclination of the wafer to correspond with the reference, thus bringing the wafer into a parallel relationship with the reticle.

Yet another useful feature of the present invention is that focus of the pattern image on the wafer may be optimized for one point in the image, and inclination of the wafer may be adjusted about that point, such that once parallelism between reticle and wafer is established, all points in the image are in optimum focus.

The tilt sensing system is designed to share one or more optical elements with the Half Dyson Projection optical system. As such, it may be integrated into the Half Dyson system projection optical system without modification of that system or any optical subsystems associated therewith.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. For instance, the light source in FIGS. 2b and 2c need not be LED'S. Any source of visible or invisible radiation, including lasers, may be used, so long as its radiation wavelength is reflected by the reflective reticle pattern 106 and by the reflective upper surface 100 of wafer 102. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. In a microlithographic stepper employing unit magnification optics for imaging a reflective pattern disposed on a surface of a reticle onto a reflective surface of a wafer; the combination therewith comprising:

tilt-sensing means including a source of radiation separately reflected from said reflective pattern disposed on said surface of said reticle and from said reflective surface of said wafer for independently sensing the angular position of said surface of said reticle and the angular position of said surface of said wafer to determine thereby whether or not said surface of said reticle and said surface of said wafer are substantially parallel to one another.

2. The microlithographic stepper defined in claim 1, wherein said combination further comprises:

adjustment means responsive to said respective surfaces having been determined by said tilt-sensing means to be not parallel to one another for angularly adjusting the angular position of at least one of said reticle and said wafer to bring said respective surfaces thereof into a substantially parallel relationship, with one another.

3. The microlithographic stepper defined in claim 1, wherein said unit magnification optics comprises a Half-Field Dyson projection optical system incorporating a spherical primary mirror and lenses symmetrically disposed about an optic axis that are designed to image said reflective reticle pattern through a window in said reticle onto said reflective surface of said wafer; and wherein said source of radiation of said tilt-sensing means comprises:

a point source of alternate 1st or 2nd radiation divergent beams that are angularly inclined with respect to said optic axis, said point source being located beyond a first edge of said primary mirror which is situated in the vicinity of an extension of the spherical surface of said primary mirror, said alternate 1st beam being directed to said reflective reticle-pattern surface, such that, after passing through and being collimated by said lenses, it is incident thereon at substantially a given oblique angle $\theta$ with respect to said optic axis, and said alternate 2nd beam being directed to said reflective wafer surface such that, after passing through and being collimated by said lenses and then through said window in said reticle, it is incident on said window at substantially said given oblique angle $\theta$ with respect to said optic axis, whereby said alternate 1st beam is reflected from said reflective reticle-pattern surface and said alternate 2nd beam is reflected from said reflective wafer surface; and two-dimensional position detection means located beyond a second edge of said primary mirror which is situated opposite to said first edge thereof and in the vicinity of an extension of the spherical surface of said primary mirror, such that said reflected alternate 1st beam, after passing through said lenses converges to a focus at a first position within the useful aperture of said two-dimensional position detection means which is determined by the angular position of said reflective reticle-pattern surface with respect to said optic axis, and such that said reflected alternate 2nd beam, after passing through said lenses converges to a focus at a second position within the useful aperture of said two-dimensional position detection means which is determined by the angular position of said reflective wafer surface with respect to said optic axis; whereby the detection of any difference in either of said two dimensions of said first and second positions is indicative of said reflective reticle-pattern surface and said reflective wafer surface being out-of-parallel with respect to one another.

4. The microlithographic stepper defined in claim 3, wherein:

each of said alternate 1st and 2nd diverging beams is inclined with respect to said optic axis at that angle of inclination which results in said given oblique angle $\theta$ at the reticle surfaces being substantially equal to Brewster's angle.

5. The microlithographic stepper defined in claim 4, wherein said said tilt-sensing means further comprises:

a polarizer situated between said point source and said position detection means in the path of said alternate 1st and 2nd beams, said polarizer being oriented to transmit only that component of the electric vector of said radiation which is oriented substantially parallel to the plane that includes said angle of inclination and said optic axis.

6. The microlithographic stepper defined in claim 3, wherein said said tilt-sensing means further comprises:

a polarizer situated between said point source and said position detection means in the path of said alternate 1st and 2nd beams, said polarizer being oriented to transmit only that component of the electric vector of said radiation which is oriented substantially parallel to the plane that includes said angle of inclination and said optic axis.

7. The microlithographic stepper defined in claim 3, wherein said point source of alternate 1st or 2nd radiation divergent beams comprises:

first means including a first light-emitting diode (LED) at a given position that may be switched on or off and a first condenser lens, said first means emitting a first light beam, as one of said alternate 1st or 2nd radiation beams, only when said first LED is switched on, which first light beam appears to originate from a given point; and second means including a second LED at a position displaced from said given position that may be switched on or off, a fold mirror and first condenser lens, said second means emitting a second light beam, as the other of said alternate 1st or 2nd radiation beams, only when said second LED is switched on, which second light beam also appears to originate from said given point;

whereby said alternate first light beam is derived by switching on said first LED and switching off said second LED, and said alternate second light beam is derived by switching on second LED and switching off said first LED.

8. The microlithographic stepper defined in claim 7, wherein said point source of alternate 1st or 2nd radiation divergent beams further comprises:

a doublet lens in the path of both said first and second light beams for determining the degree of divergence thereof by changing the apparent point of origination of said said first and second light beams from said given point.

9. The microlithographic stepper defined in claim 3, wherein said point source of alternate 1st or 2nd radiation divergent beams comprises:

a light-emitting diode (LED) means emitting a diverging light beam;

a collimating lens in the path of said diverging light beam for deriving therefrom a collimated light beam of a given width;

a switchable shutter in the path of said collimated light beam for passing substantially one-half of the width of said collimated light beam in a first switch position thereof, and for passing substantially the other one-half of the width of said collimated light beam in a second switch position thereof; and a focusing lens in the path of the entire width of said collimated light beam for focusing that one-half thereof which has been passed by said switchable shutter to a given point;

whereby said given point constitutes said point source of alternate 1st or 2nd radiation divergent beams.

10. The microlithographic stepper defined in claim 9, wherein:

said switchable shutter comprises a liquid-crystal shutter.

11. The microlithographic stepper defined in claim 3, wherein said two-dimensional position detection means comprises:

a position-sensitive detector for receiving a focused spot of a radiation beam within its useful aperture, and for deriving a first signal indicative of the position offset of said focused spot in a first of two orthogonal dimensions with respect to the center of said useful aperture of said position-sensitive detector and a second signal indicative of the position offset of said focused spot in a second of said two orthogonal dimensions with respect to the center of said useful aperture of said position-sensitive detector.

12. The microlithographic stepper defined in claim 11, wherein said two-dimensional position detection means further comprises:

a fold prism for focusing either said reflected alternate 1st or 2nd radiation beam to said focused spot received within said useful aperture of said position-sensitive detector.

13. The microlithographic stepper defined in claim 12, wherein said microlithographic stepper further comprises:

a stage for supporting said wafer that is angularly movable in each of two dimensions; and computer-controlled servo means, responsive to said first and second position-offset signals derived from said focused spot of said reflected alternate 1st radiation beam being received within said useful aperture of said position-sensitive detector and responsive to said first and second position-offset signals derived from said focused spot of said reflected alternate 2nd radiation beam being received within said useful aperture of said position-sensitive detector, for angularly moving said wafer-supporting stage in each of said two dimensions to that angular position in which said reflective surface of said wafer is adjusted to be substantially parallel to the reflective surface of said reticle pattern.

* * * * *